United States Patent
Schreter

(10) Patent No.: US 12,119,845 B2
(45) Date of Patent: *Oct. 15, 2024

(54) DATA COMPRESSION FOR COLUMNAR DATABASES INTO ARBITRARILY-SIZED PERSISTENT PAGES

(71) Applicant: SAP SE, Walldorf (DE)

(72) Inventor: Ivan Schreter, Malsch (DE)

(73) Assignee: SAP SE, Walldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/483,824

(22) Filed: Oct. 10, 2023

(65) Prior Publication Data
US 2024/0048153 A1 Feb. 8, 2024

Related U.S. Application Data

(63) Continuation of application No. 17/480,819, filed on Sep. 21, 2021, now Pat. No. 11,824,565.

(51) Int. Cl.
*H03M 7/30* (2006.01)
*G06F 16/22* (2019.01)
*H03M 7/40* (2006.01)

(52) U.S. Cl.
CPC ........ *H03M 7/3088* (2013.01); *G06F 16/221* (2019.01); *H03M 7/3077* (2013.01); *H03M 7/4081* (2013.01)

(58) Field of Classification Search
CPC ............. H03M 7/3088; H03M 7/3077; H03M 7/4081; G06F 16/221; G06F 17/30315
See application file for complete search history.

(56) References Cited

U.S. PATENT DOCUMENTS 11,824,565 B2 * 11/2023 Schreter ................ G06F 16/221

* cited by examiner

*Primary Examiner* — Joseph J Lauture
(74) *Attorney, Agent, or Firm* — Mintz Levin Cohn Ferris Glovsky and Popeo, P.C.

(57) ABSTRACT

A method for compressing columnar data may include generating, for a data column included in a data chunk, a dictionary enumerating, in a sorted order, a first set of unique values included in the first data column. A compression technique for generated a compressed representation of the data column having a fewest quantity of bytes may be identified based at least on the dictionary. The compression technique including a dictionary compression applying the dictionary and/or another compression technique. A compressed data chunk may be generated by applying the compression technique to compress the data column included in the data chunk. The compressed data chunk may be stored at a database in a variable-size persistent page whose size is allocated based on the size of the compressed representation of the data column. Related systems and articles of manufacture are also provided.

20 Claims, 4 Drawing Sheets

DATA COMPRESSION FOR COLUMNAR DATABASES INTO ARBITRARILY-SIZED PERSISTENT PAGES

CROSS REFERENCE TO RELATED APPLICATIONS

This application is a continuation of application Ser. No. 17/480,819 filed Sep. 21, 2021, entitled "DATA COMPRESSION FOR COLUMNAR DATABASES INTO ARBITRARILY-SIZED PERSISTENT PAGES." The disclosure of which is incorporated herein by reference in its entirety.

TECHNICAL FIELD

The subject matter described herein relates generally to database processing and more specifically to compression techniques for columnar data.

BACKGROUND

A database may be configured to store an organized collection of data. For example, data held in a relational database may be organized in accordance with a schema defining one or more relations, each of which being a set of tuples sharing one or more common attributes. The tuples of a relation may occupy the rows of a database table while the columns of the database table may store the values of the common attributes shared by the tuples. Moreover, one or more attributes may serve as keys that establish and identify relationships between the relations occupying different database tables. The database may support a variety of database operations for accessing the data stored in the database. For instance, the database may support transactional processing (e.g., on-line transactional processing (OLTP)) that modifies the data stored in the database. Alternatively and/or additionally, the database may support analytical processing (e.g., on-line analytical processing (OLAP)) that evaluates the data stored in the database.

SUMMARY

Systems, methods, and articles of manufacture, including computer program products, are provided for compressing columnar data. In some example embodiments, there is provided a system that includes at least one processor and at least one memory. The at least one memory may include program code that provides operations when executed by the at least one processor. The operations may include: generating, for a first data column included in a data chunk, a first dictionary enumerating, in a sorted order, a first set of unique values included in the first data column; identifying, based at least on the first dictionary, a first compression technique for generating a first compressed representation of the first data column having a fewest quantity of bytes, the first compression technique including a dictionary compression applying the first dictionary and/or another compression technique; generating a compressed data chunk by at least applying the first compression technique to compress the first data column included in the data chunk; and storing, in a persistent page at a database, the compressed data chunk.

In some variations, one or more features disclosed herein including the following features can optionally be included in any feasible combination. The persistent page may be associated with a variable size. The persistent page may be allocated based at least on a size of the first compressed representation of the first data column such that a size of the persistent page corresponds to that of the compressed data chunk.

In some variations, the first compression technique may include a null-value compression instead of the dictionary compression if the first dictionary includes a single NULL value.

In some variations, the first compression technique may include a single-value compression instead of the dictionary compression if the first dictionary includes a single non-NULL value.

In some variations, the first compression technique may include the dictionary compression if the first dictionary includes multiple non-NULL values and a first size of the first data column is greater than a second size of the first dictionary and a data vector generated by replacing each value in the first data column with a corresponding index value from the first dictionary.

In some variations, the first compression technique may include a prefix/suffix compression instead of or in addition to the dictionary compression if the first dictionary includes more than a threshold quantity of unique values with prefixes and/or suffixes.

In some variations, the first compression technique may include a run-length encoding instead of or in addition to the dictionary compression if the first data column includes less than a threshold quantity of runs of a same value and/or the first dictionary is less than a threshold size.

In some variations, the first compression technique may include a frame of reference compression instead of or in addition to the dictionary compression if the first dictionary includes less than a threshold quantity of outlier values relative to a range of values.

In some variations, the database may include a columnar database.

In some variations, the operations may further include: generating, for a second data column included in the data chunk, a second dictionary enumerating, in the sorted order, a second set of unique values included in the second data column; identifying, based at least on the second dictionary, a second compression technique for generating a second compressed representation of the second data column having the fewest quantity of bytes, the second compression technique including a dictionary compression applying the second dictionary and/or another compression technique; and generating the compressed data chunk including by applying the second compression technique to compress the second data column included in the data chunk.

In another aspect, there is provided a method for compressing columnar data. The method may include: generating, for a first data column included in a data chunk, a first dictionary enumerating, in a sorted order, a first set of unique values included in the first data column; identifying, based at least on the first dictionary, a first compression technique for generating a first compressed representation of the first data column having a fewest quantity of bytes, the first compression technique including a dictionary compression applying the first dictionary and/or another compression technique; generating a compressed data chunk by at least applying the first compression technique to compress the first data column included in the data chunk; and storing, in a persistent page at a database, the compressed data chunk.

In some variations, one or more features disclosed herein including the following features can optionally be included in any feasible combination. The persistent page may be associated with a variable size. The persistent page may be allocated based at least on a size of the first compressed representation of the first data column such that a size of the persistent page corresponds to that of the compressed data chunk.

In some variations, the first compression technique may include a null-value compression instead of the dictionary compression if the first dictionary includes a single NULL value.

In some variations, the first compression technique may include a single-value compression instead of the dictionary compression if the first dictionary includes a single non-NULL value.

In some variations, the first compression technique may include the dictionary compression if the first dictionary includes multiple non-NULL values and a first size of the first data column is greater than a second size of the first dictionary and a data vector generated by replacing each value in the first data column with a corresponding index value from the first dictionary.

In some variations, the first compression technique may include a prefix/suffix compression instead of or in addition to the dictionary compression if the first dictionary includes more than a threshold quantity of unique values with prefixes and/or suffixes.

In some variations, the first compression technique may include a run-length encoding instead of or in addition to the dictionary compression if the first data column includes less than a threshold quantity of runs of a same value and/or the first dictionary is less than a threshold size.

In some variations, the first compression technique may include a frame of reference compression instead of or in addition to the dictionary compression if the first dictionary includes less than a threshold quantity of outlier values relative to a range of values.

In some variations, the method may further include: generating, for a second data column included in the data chunk, a second dictionary enumerating, in the sorted order, a second set of unique values included in the second data column; identifying, based at least on the second dictionary, a second compression technique for generating a second compressed representation of the second data column having the fewest quantity of bytes, the second compression technique including a dictionary compression applying the second dictionary and/or another compression technique; and generating the compressed data chunk including by applying the second compression technique to compress the second data column included in the data chunk.

In another aspect, there is provided a computer program product including a non-transitory computer readable medium storing instructions. The instructions may cause operations may executed by at least one data processor. The operations may include: generating, for a first data column included in a data chunk, a first dictionary enumerating, in a sorted order, a first set of unique values included in the first data column; identifying, based at least on the first dictionary, a first compression technique for generating a first compressed representation of the first data column having a fewest quantity of bytes, the first compression technique including a dictionary compression applying the first dictionary and/or another compression technique; generating a compressed data chunk by at least applying the first compression technique to compress the first data column included in the data chunk; and storing, in a persistent page at a database, the compressed data chunk.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also described that may include one or more processors and one or more memories coupled to the one or more processors. A memory, which can include a non-transitory computer-readable or machine-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including, for example, to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to an on-disk columnar database, it should be readily understood that such features are not intended to be limiting. The claims that follow this disclosure are intended to define the scope of the protected subject matter.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

In the drawings.

When practical, similar reference numbers denote similar structures, features, or elements.

DETAILED DESCRIPTION

Figure 1:
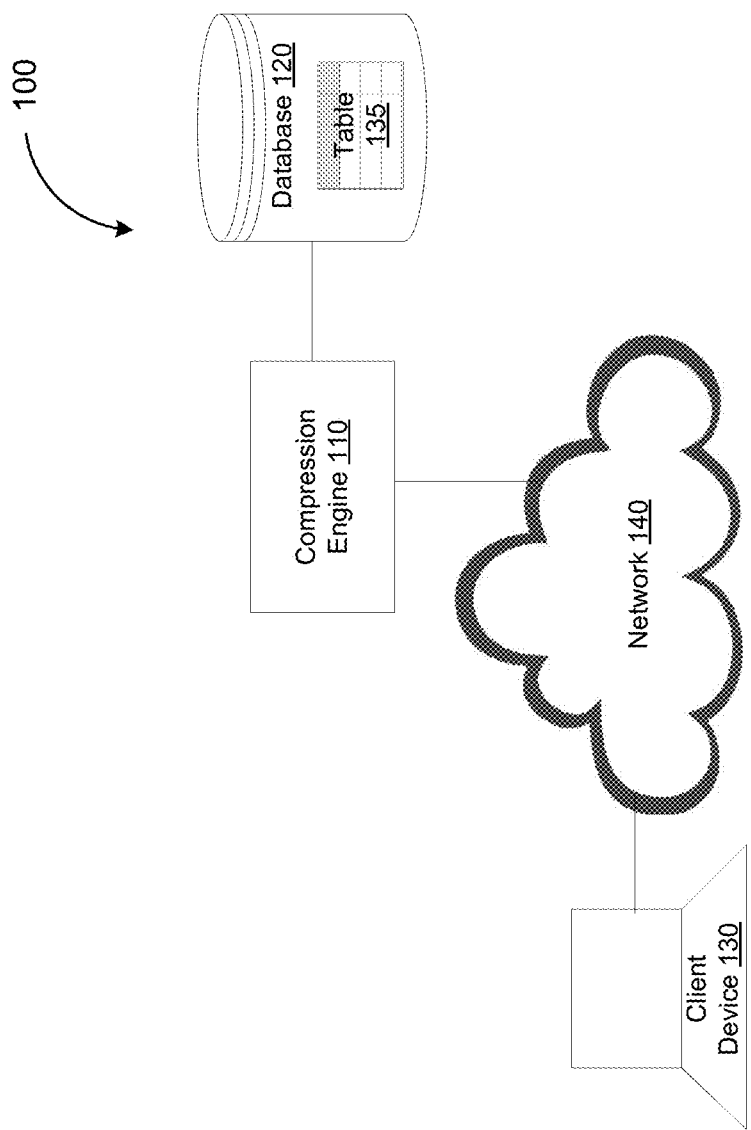
FIG. 1 depicts a system diagram illustrating an example of a database system, in accordance with some example embodiments.

A column-oriented database or a columnar database stores data from database tables by columns instead of by rows. As noted, the tuples of a relation may occupy the rows of a database table while the columns of the database table may store the values of the common attributes shared by the tuples. Thus, in the columnar database, the values occupying each column of the database table, which may span multiple rows (or tuples) of the database table, may be stored sequentially in one or more data pages, with each data page storing at least a portion of a column. Contrastingly, in a row based database, the values occupying each row (or tuple) of the database table, which may span multiple columns of the database table, may be stored sequentially in one or more data pages.

To maximize storage efficiency, the data stored in a database may be compressed. For example, an in-memory columnar database may apply various compression technique to compress each column of the database tables stored at the in-memory columnar database. One example compression technique is dictionary compression, which include computing a dictionary of the unique values present in each column and storing an index to the dictionary in each cell of the column in place of the actual value. In some cases, the in-memory columnar database may employ a two-fragment table in which new data is held in a delta fragment of a table before being transferred to a main fragment of the table during periodic delta merges that also include removing deleted rows. While the main fragment is read-optimized and static, the delta fragment may be write-optimized and dynamic. For instance, the delta fragment may be represented as a binary tree (B-tree) in memory. During a delta merge, a new dictionary may be computed for the main fragment and used to compress the data being transferred from the delta fragment to the main fragment. A delta merge operation may thus require reading and recompressing entire database tables. Given the computational expenses associated with the delta merge operation, the delta fragment may grow to a significant size (e.g., potentially millions of rows of data) before being merged with the main fragment in order to amortize the corresponding costs. Moreover, additional compression techniques may be applied to the main fragment of the table to further increase the compression ratio. The columns may also be sorted based on column selectivity before the data in each column is sorted to achieve yet higher compression ratios for some columns.

However, unlike an in-memory columnar database, a cloud-based columnar database may rely primarily on secondary storage, which renders the merging and compression of entire database tables prohibitively expensive. Thus, instead of two-fragment table, many small fragments may be created with a one-to-one correspondence to persistent pages on disk. For example, uncompressed data may be ingested one chunk at a time before being compressed, in batches, into a single page. Doing so obviates the computationally expensive delta merge operation. Moreover, since compressed chunks are fairly small (e.g., tens to hundreds of kilobytes) and individual column parts are even smaller (e.g., up to tens of kilobytes), central processing unit (CPU) caches may be leveraged to further expedite the compression process. Operating on the data in chunks may also allow for the selection of the best possible compression techniques, which may offset the lack of global compression optimization across entire database tables.

As such, in some example embodiments, a compression engine may compress one or more chunks of data ingested for storage in a columnar database, such as a cloud-based columnar database configured to store the compressed chunks of data in one or more persistent pages on disk. Each chunk of data may include one or more column parts, each of which corresponding to at least a portion of a column of a database table. For each data chunk, the compression engine may apply one or more compression techniques determined to yield the smallest compressed representation of each column of data present in the data chunk (e.g., a compressed representation having a fewest quantity of bytes). Examples of compression techniques include dictionary compression, single-value compression, null-only compression, variable-size data encodings, and prefix/suffix compression.

In some example embodiments, to identify one or more compression techniques yielding the smallest compressed representation of a column of data, the compression engine may compute, for the column, a dictionary enumerating the unique values present in the column in a sorted order. Moreover, the compression engine may determine, based at least on information collected during the computation of the dictionary, whether to apply dictionary compression or a different compression technique (e.g., null-only compression, single-value compression, prefix/suffix compression, frame of reference compression, run-length encoding, and/or the like) that provides a higher compression ratio than dictionary compression. Instead of a naïve approach in which the compression engine evaluates the performance of each available compression technique individually, the compression engine may use the information collected during the computation of the dictionary to identify one or more compression techniques yielding the smallest possible representation of the column. In some cases, the compression engine may determine to apply multiple compression techniques in order to achieve the smallest compressed representation of the column. Alternatively, in some cases, the compression engine may determine to forego compression altogether, in which case the uncompressed column may be stored in the persistent page. The columnar database may be configured to support variable sized persistent pages. As such, the compression engine may further allocate a persistent page corresponding to the size of the compressed data chunk.

FIG. 1 depicts a system diagram illustrating an example of a database system 100, in accordance with some example embodiments. Referring to FIG. 1, the database system 100 may include a compression engine 110, which may be coupled with a database 120, and a client device 130. As shown in FIG. 1, the compression engine 110 and the client device 130 may be communicative coupled via a network 140. The database 120 may be a columnar database including, for example, a cloud-based columnar database configured to store columnar data in one or more persistent pages on disk. The client device 130 may be a processor-based device including, for example, a mobile device, a wearable apparatus, a personal computer, a workstation, an Internet-of-Things (IoT) appliance, and/or the like. The network 140 may be a wired network and/or wireless network including, for example, a public land mobile network (PLMN), a local area network (LAN), a virtual local area network (VLAN), a wide area network (WAN), the Internet, and/or the like.

In some example embodiments, the database 120 may ingest data from the client device 130 for storage. As shown in FIG. 1, the data from the client device 130 may include one or more database tables such as, for example, the database table 135. Accordingly, the database 120 may ingest the data in one or more data chunks, each of which including one or more column parts corresponding to at least a portion of a column of the database table 135. The compression engine 110 may compress each data chunk by applying one or more compression techniques determined to yield a smallest compressed representation (e.g., a compressed representation having a fewest quantity of bytes) of each column present in the data chunk. Examples of compression techniques include dictionary compression, single-value compression, null-only compression, variable-size data encodings, and prefix/suffix compression.

Figure 2:
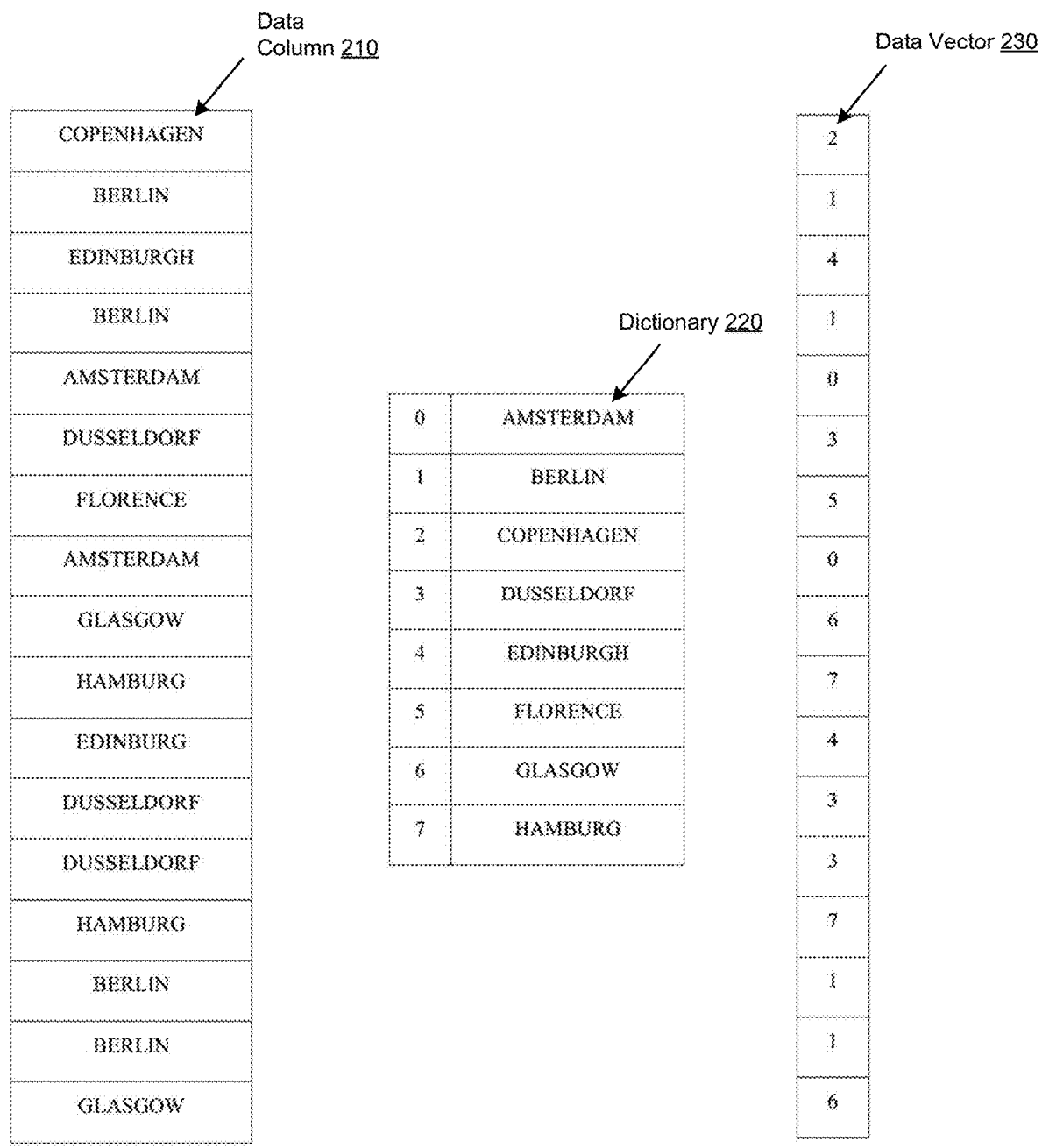
FIG. 2 depicts a schematic diagram illustrating an example of dictionary compression, in accordance with some example embodiments.

To identify one or more compression techniques yielding the smallest compressed representation of a column of data, the compression engine 110 may compute, for the column of data, a dictionary enumerating the unique values present in the column in a sorted order. To further illustrate, FIG. 2 depicts a schematic diagram illustrating an example of dictionary compression, in accordance with some example embodiments. The compression engine 110 may compute, for a data column 210, a dictionary 220 enumerating the unique values present in the data column 210 in a sorted order. The data column 210 may be part of the database table 135 being ingested for storage at the database 120. Moreover, the data column 210 may be part of a data chunk including one or more column parts corresponding to at least a portion of the data column 210. As shown in FIG. 2, the dictionary 220 may map, to an index value, each unique value present in the data column 210. For example, the value "AMSTERDAM" may be mapped to the index value "0" while the value "BERLIN" may be mapped to the index value "1." Moreover, the values present in the dictionary 220 may be in a sorted order such as, for example, an ascending order, a descending order, and/or the like. To compress the data column 210 using dictionary compression, each value present in the data column 210 may be replaced by a corresponding index value. The resulting data vector 230, combined with the dictionary 220, may form the compressed representation of the data column 210. As such, it should be appreciated that the compression ratio associated with dictionary compression may correspond to a first size of the data column 210 relative to a second size of the dictionary 220 and the data vector 230.

In some example embodiments, the compression engine 110 may identify, based at least on information collected during the computation of the dictionary 220, one or more compression techniques yielding the smallest compressed representation of the data column 210. The compression engine 110 may use the information collected during the computation of the dictionary 220 instead of a naïve approach in which the compression engine 110 evaluates the performance of each available compression technique individually. By leveraging the information collected during the computation of the dictionary 220, the compression engine 110 may be able to identify one or more optimal compression techniques in as few passes across the data column 210 as possible, thereby minimizing the computation costs associated with compressing the data column 210. The compression engine 110 may identify one or more compression techniques yielding the smallest compressed representation of each data column included in the same data chunk as the data column 210 before allocating a persistent page having a size corresponding to the combined size of the compressed columns in the data chunk for storing the data chunk in the database 120.

To further illustrate, Table 1 below depicts pseudo programming code for generating the dictionary 220 and the data vector 230 forming the compressed representation of the data column 210.

TABLE 1

```
auto prepare_compressed_chunk(T data[ ], int size) –> ??
{
   // Allocate temporary arrays with values and cell indices on the stack with the capacity equal
to the cell count in the column chunk.
   T dictionary[size];
   int index_permutation[size];
   // For each value in the column chunk, enter the cell value and index into the two arrays.
   // (For variable-sized values, pointer to the value is used internally.)
   for (int i = 0; i < size; ++i)
   {
      dictionary[i] = data[i];
      index_permutation[i] = i;
      // ((1)) Do any operations on the value to prepare state for potential other compression
methods.
      ...
   }
   // Sort the two temporary arrays in lockstep by cell value. I.e., when swapping values in
sort_array, also swap values in index_permutation.
   // - if NULL values are present, comparison operator orders NULL values after all valid
values.
      auto compare = [&](int i1, int i2) –> bool { return dictionary[i1] < dictionary[i2]; };
      auto swap = [&](int i1, int i2) { swap(dictionary[i1], dictionary[i2]);
swap(index_permutation[i1], index_permutation[i2]; )};
      sort(size, compare, swap);
      // Allocate a temporary array for value indices on the stack with the capacity equal to the cell
count in the column chunk.
      int value_index[size];
      // Enter the first value found in the sorted array at the index 0 of the dictionary array and set
dictionary index at the corresponding index to 0.
      value_index[index_permutation[0]] = 0;
      // ((2)) Do any operations on dictionary value at index 0 to prepare state for potential other
compression methods.
      ...
      // Scan the rest of the array to create unique dictionary and index vector by incrementing
index each time a new value is encountered.
      int dict_size = 1;
      int last_value_index = 0;
      for (int i = 1; i < size; ++i)
```

TABLE 1-continued

```
{
   if (dictionary[i] != dictionary[last_value_index])
   {
      last_value_index = i;
      dictionary[dict_size] = dictionary[i]
      ++dict_size;
      // ((2)) Do any operations on dictionary value (dict_size-1) to prepare state for potential
other compression methods.
      ...
   }
   value_index[index_permutation[i]] = dict_size - 1;
}
// ((3)) Finalize results; dictionary with size dict_size and data vector value_index with size
size are now filled.
   ...
}
```

Compared to B-tree dictionary construction for the delta fragment of an in-memory columnar database, constructing a dictionary in the manner set forth in Table 1 consumes far less computational resources. For example, an entire data chunk and the temporary arrays generated during the construction of the corresponding dictionaries may fit into the Level 1 cache (L1 cache) of a central processing unit (CPU), thus achieving a very high sort and compression performance compared to the random accesses into memory used for constructing a significantly larger B-tree dictionary. Accordingly, the database 120 may be able to ingest data at a higher rate than current state-of-art databases. Moreover, the compression engine 110 may also achieve better compression ratios for each column (or column part) compared to state-of-the art on-disk columnar databases, which either do not use compression or use only whole-column dictionary compression.

Referring again to the example shown in FIG. 2, the compression engine 110 may determine, based on one or more characteristics of the dictionary 220, one or more compression techniques yielding the smallest compressed representation of the data column 210. For example, in some cases, the compression engine 110 may determine to apply null-value compression instead of dictionary compression if the dictionary 220 contains a single entry having a NULL value. When null-value compression is selected, the data column 210 will not be encoded on the resulting compressed page at all. Alternatively, the compression engine 110 may determine to apply single-value compression if the dictionary 220 contains a single entry having a non-NULL value. When single-value compression is used, the resulting compressed page may store the single value without any per-row data. In the event the dictionary 220 includes multiple entries, the compression engine 110 may determine to apply dictionary compression unless the second size of the dictionary 220 and the data vector 230 exceeds the first size of the data column 210, in which case the data column 210 may be stored without any form of compression.

In some example embodiments, the compression engine 110 may determine to apply prefix/suffix compression instead of or in addition to dictionary compression if the dictionary 220 includes more than a threshold quantity of unique values with prefixes (e.g., leading zeroes) and/or suffixes (e.g., trailing zeroes). For example, the compression engine 110 may determine to apply prefix/suffix compression to time-series data, which may include numerous unique values. With time-series data, a greater compression ratio may be achieved by applying prefix/suffix compression than by applying dictionary compression. In fact, because of the many unique values present in time series data, the compression achieved by applying dictionary compression may be minimal.

In some example embodiments, the compression engine 110 may detect, in the dictionary 220, one or more runs of a same value, in which case the compression engine 110 may determine to apply run-length encoding instead of or in addition to dictionary compression. For example, the compression engine 110 may determine to apply run-length encoding to compress the data column 210 if it includes less than a threshold quantity of runs of a same value. Run-length encoding may be more efficient than dictionary compression if the size of the dictionary 220 is small. Accordingly, in some cases, the compression engine 110 may determine to apply run-length encoding instead of dictionary compression if the dictionary 220 is less than a threshold size.

In some example embodiments, the compression engine 110 may determine to apply frame of reference compression instead of or in addition to dictionary compression if the dictionary 220 includes less than a threshold quantity of outlier values relative to a range of values. With frame of reference compression, instead of storing the actual values present in the data chunk 220, the values may be represented by a difference relative to a reference value. The reference value may be a value that is close to the other values in a same range. Thus, the performance for frame of reference compression may be inversely proportional to the quantity of outlier values (e.g., values that are outside of the range) present in the data column 210. Since frame of reference compression may be most effective when the data column 210 includes few outlier values, the compression engine 110 may determine to apply frame of reference compression instead of dictionary compression if the data chunk includes less than a threshold quantity of outlier values, as indicated by the quantity of outlier values present in the dictionary 220.

Figure 3:
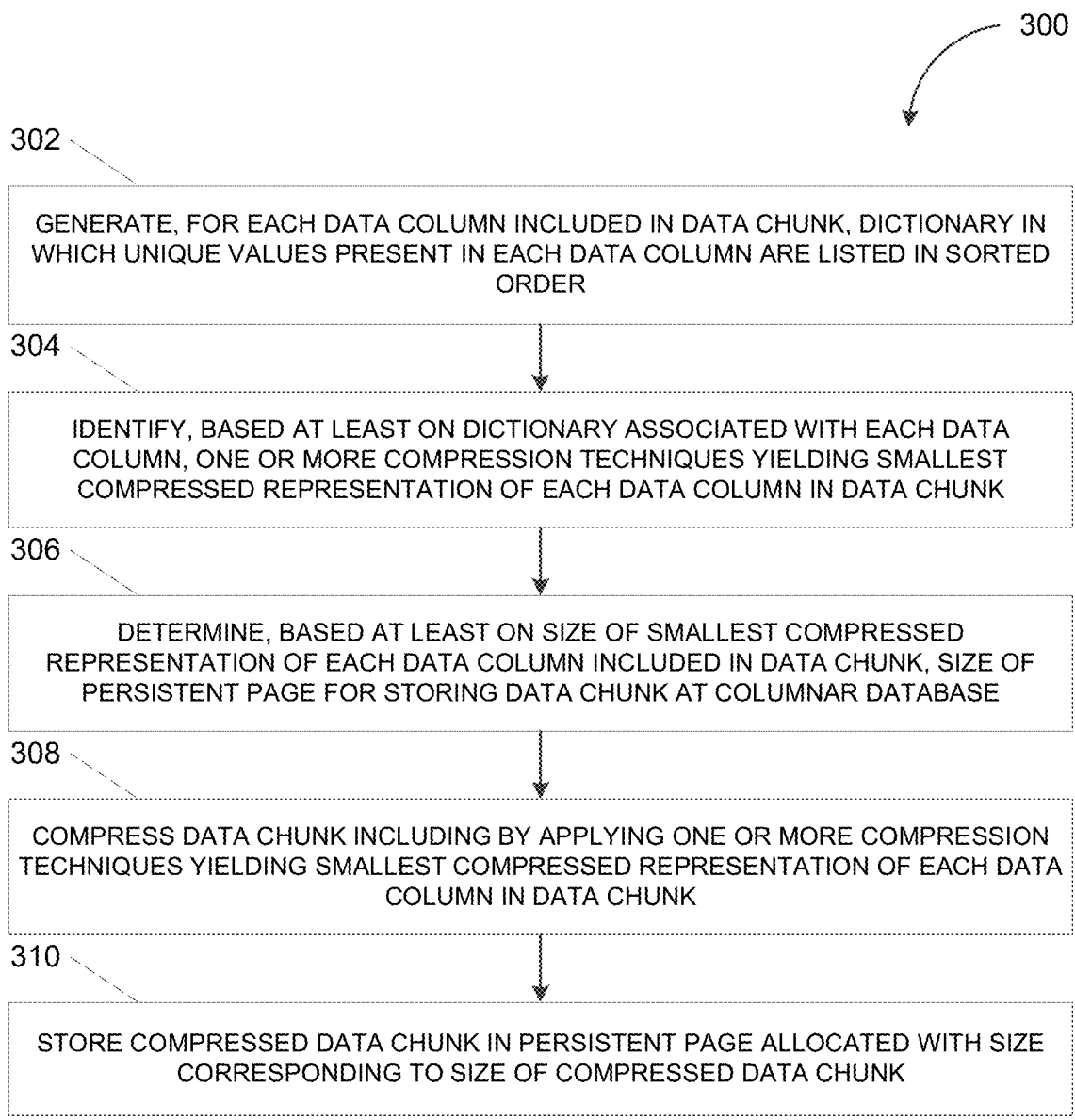
FIG. 3 depicts a flowchart illustrating an example of a process for columnar data compression, in accordance with some example embodiments.

FIG. 3 depicts a flowchart illustrating an example of a process 300 for columnar data compression, in accordance with some example embodiments. Referring to FIGS. 1-3, the process 300 may be performed by the compression engine 110 in order to compress, for example, the data column 210 for storage at the database 120.

At 302, the compression engine 110 may generate, for each data column included in a data chunk, a dictionary in which the unique values present in each data column are listed in a sorted order. For example, the compression engine 110 may generate, for the data column 210, the dictionary 220 enumerating the unique values present in the data column 210 in a sorted order. The data column 210 may be part of the database table 135 being ingested for storage at the database 120. Moreover, the data column 210 may be part of a data chunk including one or more column parts corresponding to at least a portion of the data column 210. Operating on the data in chunks may also allow for the selection of the best possible compression technique for each column (or column part) present in individual data chunks, which may offset the lack of global compression optimization across entire database tables. Moreover, because an entire data chunk and the temporary arrays generated during the construction of the corresponding dictionaries may fit into the Level 1 cache (L1 cache) of a central processing unit (CPU), the compression engine 110 may be able to achieve a very high sort and compression performance, especially when compared to the random accesses into memory used for constructing a significantly larger B-tree dictionary At 304, the compression engine 110 may identify, based at least on the dictionary associated with each data column, one or more compression techniques yielding a smallest compressed representation of each data column in the data chunk. In some example embodiments, the compression engine 110 may identify, based at least on the information collected during the generation of the dictionary 220, one or more compression techniques yielding the smallest compressed representation of the data column 210. For example, the compression engine 110 may determine to apply null-value compression instead of dictionary compression if the dictionary 220 contains a single entry having a NULL value. Alternatively, the compression engine 110 may determine to apply single-value compression if the dictionary 220 contains a single entry having a non-NULL value. In the event the dictionary 220 includes multiple entries, the compression engine 110 may determine to apply dictionary compression unless the second size of the dictionary 220 and the data vector 230 exceeds the first size of the data column 210, in which case the data column 210 may be stored without any form of compression.

In some example embodiments, the compression engine 110 may determine to apply prefix/suffix compression instead of or in addition to dictionary compression if the dictionary 220 includes more than a threshold quantity of unique values with prefixes (e.g., leading zeroes) and/or suffixes (e.g., trailing zeroes). Alternatively, the compression engine 110 may detect, in the data column 210 less than a threshold quantity of runs of a same value, in which case the compression engine 110 may determine to apply run-length encoding instead of or in addition to dictionary compression. For example, the compression engine 110 may determine to apply run-length encoding to compress the data column 210 if the dictionary 220 includes more than a threshold quantity of runs of a same value and/or if the dictionary 220 is less than a threshold size. The compression engine 110 may also determine to apply frame of reference compression instead of or in addition to dictionary compression if the dictionary 220 includes less than a threshold quantity of outlier values relative to a range of values, in which case frame of reference compression may yield a higher compression ratio than dictionary compression.

At 306, the compression engine 110 may determine, based at least on a size of the smallest compressed representation of each data column included in the data chunk, a size of a persistent page for storing the data chunk at a columnar database. In some example embodiments, the database 120 may be configured to support variable sized persistent pages. As such, the compression engine 110 may further allocate a persistent page corresponding to the size of the compressed data chunk. For example, the compression engine 110 may determine the size of a persistent page for storing the compressed data chunk if one or more compression techniques selected in operation 304 are applied to yield the smallest compressed representation of each data column included in the data chunk.

At 308, the compression engine 110 may compress the data chunk including by applying the one or more compression techniques yielding the smallest compressed representation of each data column in the data chunk. For example, the compression engine 110 may compress the data chunk by compressing each data column in the data chunk. Examples of compression techniques that may yield the smallest compressed representation of each data column in the data chunk include dictionary compression, single-value compression, null-only compression, variable-size data encodings, and prefix/suffix compression.

At 310, the compression engine 110 may store the compressed data chunk in the persistent page allocated with a size corresponding to the size of compressed data chunk. For example, the compressed data chunk, which may include the smallest compressed representation of the data column 210, may be stored in the allocated persistent page at the database 120.

In view of the above-described implementations of subject matter this application discloses the following list of examples, wherein one feature of an example in isolation or more than one feature of said example taken in combination and, optionally, in combination with one or more features of one or more further examples are further examples also falling within the disclosure of this application:

Example 1: A system, comprising: at least one data processor; and at least one memory storing instructions, which when executed by the at least one data processor, result in operations comprising: generating, for a first data column included in a data chunk, a first dictionary enumerating, in a sorted order, a first set of unique values included in the first data column; identifying, based at least on the first dictionary, a first compression technique for generating a first compressed representation of the first data column having a fewest quantity of bytes, the first compression technique including a dictionary compression applying the first dictionary and/or another compression technique; generating a compressed data chunk by at least applying the first compression technique to compress the first data column included in the data chunk; and storing, in a persistent page at a database, the compressed data chunk.

Example 2: The system of example 1, wherein the persistent page is associated with a variable size, and wherein the persistent page is allocated based at least on a size of the first compressed representation of the first data column such that a size of the persistent page corresponds to that of the compressed data chunk.

Example 3: The system of any one of examples 1-2, wherein the first compression technique comprises a null-value compression instead of the dictionary compression if the first dictionary includes a single NULL value.

Example 4: The system of any one of examples 1-3, wherein the first compression technique comprises a single-value compression instead of the dictionary compression if the first dictionary includes a single non-NULL value.

Example 5: The system of any one of examples 1-4, wherein the first compression technique comprises the dictionary compression if the first dictionary includes multiple non-NULL values and a first size of the first data column is greater than a second size of the first dictionary and a data vector generated by replacing each value in the first data column with a corresponding index value from the first dictionary.

Example 6: The system of any one of examples 1-5, wherein the first compression technique comprises a prefix/suffix compression instead of or in addition to the dictionary compression if the first dictionary includes more than a threshold quantity of unique values with prefixes and/or suffixes.

Example 7: The system of any one of examples 1-6, wherein the first compression technique comprises a run-length encoding instead of or in addition to the dictionary compression if the first data column includes less than a threshold quantity of runs of a same value and/or the first dictionary is less than a threshold size.

Example 8: The system of any one of examples 1-7, wherein the first compression technique comprises a frame of reference compression instead of or in addition to the dictionary compression if the first dictionary includes less than a threshold quantity of outlier values relative to a range of values.

Example 9: The system of any one of examples 1-8, wherein the database comprises a columnar database.

Example 10: The system of any one of examples 1-9, wherein the operations further comprise: generating, for a second data column included in the data chunk, a second dictionary enumerating, in the sorted order, a second set of unique values included in the second data column; identifying, based at least on the second dictionary, a second compression technique for generating a second compressed representation of the second data column having the fewest quantity of bytes, the second compression technique including a dictionary compression applying the second dictionary and/or another compression technique; and generating the compressed data chunk including by applying the second compression technique to compress the second data column included in the data chunk.

Example 11: A method, comprising: generating, for a first data column included in a data chunk, a first dictionary enumerating, in a sorted order, a first set of unique values included in the first data column; identifying, based at least on the first dictionary, a first compression technique for generating a first compressed representation of the first data column having a fewest quantity of bytes, the first compression technique including a dictionary compression applying the first dictionary and/or another compression technique; generating a compressed data chunk by at least applying the first compression technique to compress the first data column included in the data chunk; and storing, in a persistent page at a database, the compressed data chunk.

Example 12: The method of example 11, wherein the persistent page is associated with a variable size, and wherein the persistent page is allocated based at least on a size of the first compressed representation of the first data column such that a size of the persistent page corresponds to that of the compressed data chunk.

Example 13: The method of any one of examples 11-12, wherein the first compression technique comprises a null-value compression instead of the dictionary compression if the first dictionary includes a single NULL value.

Example 14: The method of any one of examples 11-13, wherein the first compression technique comprises a single-value compression instead of the dictionary compression if the first dictionary includes a single non-NULL value.

Example 15: The method of any one of examples 11-14, wherein the first compression technique comprises the dictionary compression if the first dictionary includes multiple non-NULL values and a first size of the first data column is greater than a second size of the first dictionary and a data vector generated by replacing each value in the first data column with a corresponding index value from the first dictionary.

Example 16: The method of any one of examples 11-15, wherein the first compression technique comprises a prefix/suffix compression instead of or in addition to the dictionary compression if the first dictionary includes more than a threshold quantity of unique values with prefixes and/or suffixes.

Example 17: The method of any one of examples 11-16, wherein the first compression technique comprises a run-length encoding instead of or in addition to the dictionary compression if the first data column includes less than a threshold quantity of runs of a same value and/or the first dictionary is less than a threshold size.

Example 18: The method of any one of examples 11-17, wherein the first compression technique comprises a frame of reference compression instead of or in addition to the dictionary compression if the first dictionary includes less than a threshold quantity of outlier values relative to a range of values.

Example 19: The method of any one of examples 11-18, wherein the operations further comprise: generating, for a second data column included in the data chunk, a second dictionary enumerating, in the sorted order, a second set of unique values included in the second data column; identifying, based at least on the second dictionary, a second compression technique for generating a second compressed representation of the second data column having the fewest quantity of bytes, the second compression technique including a dictionary compression applying the second dictionary and/or another compression technique; and generating the compressed data chunk including by applying the second compression technique to compress the second data column included in the data chunk.

Example 20: A non-transitory computer readable medium storing instructions, which when executed by at least one data processor, result in operations comprising: generating, for a first data column included in a data chunk, a first dictionary enumerating, in a sorted order, a first set of unique values included in the first data column; identifying, based at least on the first dictionary, a first compression technique for generating a first compressed representation of the first data column having a fewest quantity of bytes, the first compression technique including a dictionary compression applying the first dictionary and/or another compression technique; generating a compressed data chunk by at least applying the first compression technique to compress the first data column included in the data chunk; and storing, in a persistent page at a database, the compressed data chunk.

Figure 4:
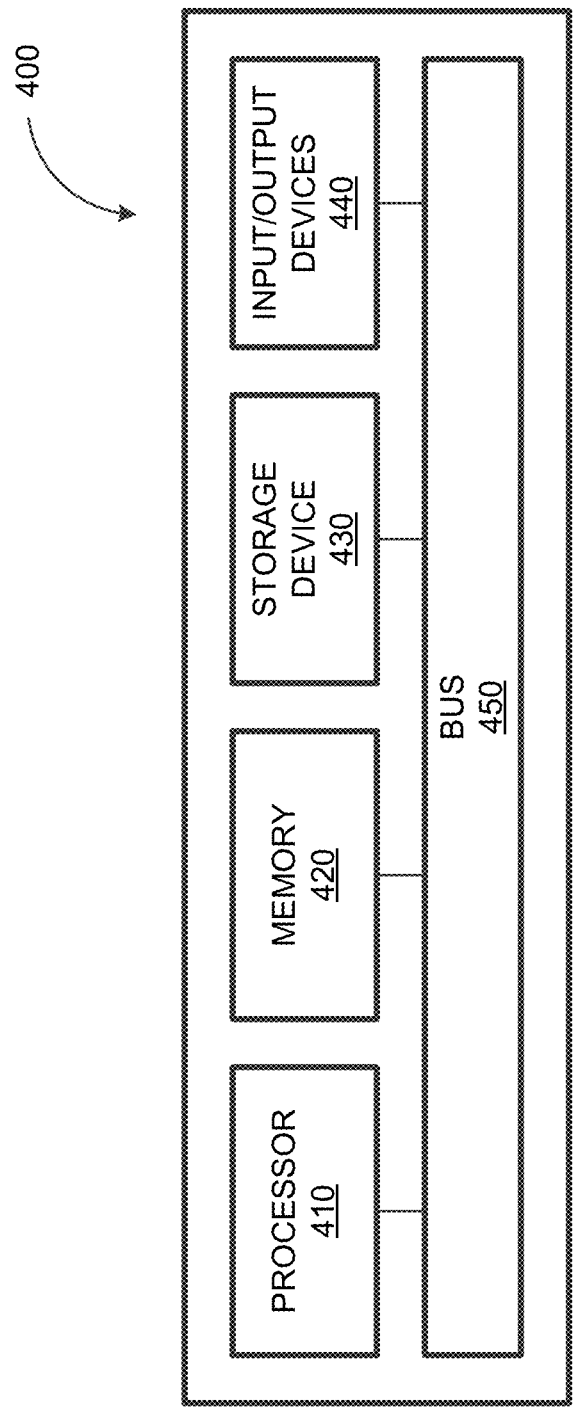
FIG. 4 depicts a block diagram illustrating an example of a computing system, in accordance with some example embodiments.

FIG. 4 depicts a block diagram illustrating an example of a computing system 400 consistent with implementations of the current subject matter. Referring to FIGS. 1-4, the computing system 400 may implement the compression engine 110 and/or any components therein.

As shown in FIG. 4, the computing system 400 can include a processor 410, a memory 420, a storage device 430, and input/output device 440. The processor 410, the memory 420, the storage device 430, and the input/output device 440 can be interconnected via a system bus 450. The processor 410 is capable of processing instructions for execution within the computing system 400. Such executed instructions can implement one or more components of, for example, the transport controller 150. In some implementations of the current subject matter, the processor 410 can be a single-threaded processor. Alternately, the processor 410 can be a multi-threaded processor. The processor 410 is capable of processing instructions stored in the memory 420 and/or on the storage device 430 to display graphical information for a user interface provided via the input/output device 440.

The memory 420 is a computer readable medium such as volatile or non-volatile that stores information within the computing system 400. The memory 420 can store data structures representing configuration object databases, for example. The storage device 430 is capable of providing persistent storage for the computing system 400. The storage device 430 can be a floppy disk device, a hard disk device, an optical disk device, or a tape device, or other suitable persistent storage means. The input/output device 440 provides input/output operations for the computing system 400. In some implementations of the current subject matter, the input/output device 440 includes a keyboard and/or pointing device. In various implementations, the input/output device 440 includes a display unit for displaying graphical user interfaces.

According to some implementations of the current subject matter, the input/output device 440 can provide input/output operations for a network device. For example, the input/output device 440 can include Ethernet ports or other networking ports to communicate with one or more wired and/or wireless networks (e.g., a local area network (LAN), a wide area network (WAN), the Internet).

In some implementations of the current subject matter, the computing system 400 can be used to execute various interactive computer software applications that can be used for organization, analysis and/or storage of data in various (e.g., tabular) format (e.g., Microsoft Excel®, and/or any other type of software). Alternatively, the computing system 400 can be used to execute any type of software applications. These applications can be used to perform various functionalities, e.g., planning functionalities (e.g., generating, managing, editing of spreadsheet documents, word processing documents, and/or any other objects, etc.), computing functionalities, communications functionalities, etc. The applications can include various add-in functionalities or can be standalone computing products and/or functionalities. Upon activation within the applications, the functionalities can be used to generate the user interface provided via the input/output device 440. The user interface can be generated and presented to a user by the computing system 400 (e.g., on a computer screen monitor, etc.).

One or more aspects or features of the subject matter described herein can be realized in digital electronic circuitry, integrated circuitry, specially designed ASICs, field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including acoustic, speech, or tactile input. Other possible input devices include touch screens or other touch-sensitive devices such as single or multi-point resistive or capacitive track pads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A system, comprising:
   at least one data processor; and
   at least one memory storing instructions which, when executed by the at least one data processor, cause operations comprising:
   identifying, based at least on a first dictionary that enumerates a first set of unique values included in a first data column included in a data chunk, a first compression technique for generating a first compressed representation of the first data column having a fewest quantity of bytes;
   generating a compressed data chunk by at least applying the first compression technique to compress the first data column included in the data chunk; and
   storing, in a persistent page at a database, the compressed data chunk.

2. The system of claim 1, wherein the persistent page is associated with a variable.

3. The system of claim 2, wherein the persistent page is allocated based at least on a size of the first compressed representation of the first data column, such that a size of the persistent page corresponds to that of the compressed data chunk.

4. The system of claim 1, wherein the first compression technique comprises a null-value compression in response to the first dictionary including a single NULL value.

5. The system of claim 1, wherein the first compression technique comprises a dictionary compression.

6. The system of claim 5, wherein the first compression technique comprises a single-value compression instead of the dictionary compression in response to the first dictionary includes a single non-NULL value.

7. The system of claim 5, wherein the first compression technique comprises a prefix/suffix compression instead of or in addition to the dictionary compression in response to the first dictionary including more than a threshold quantity of unique values with prefixes and/or suffixes.

8. The system of claim 5, wherein the first compression technique comprises a run-length encoding instead of or in addition to the dictionary compression in response to the first data column including less than a threshold quantity of runs of a same value and/or the first dictionary is less than a threshold size.

9. The system of claim 5, wherein the first compression technique comprises a frame of reference compression instead of or in addition to the dictionary compression in response to the first dictionary including less than a threshold quantity of outlier values relative to a range of values.

10. The system of claim 1, wherein the database comprises a columnar database.

11. The system of claim 1, further comprising:
    generating, for a second data column included in the data chunk, a second dictionary enumerating, in a sorted order, a second set of unique values included in the second data column.

12. The system of claim 11, further comprising:
    identifying, based at least on the second dictionary, a second compression technique for generating a second compressed representation of the second data column having the fewest quantity of bytes, the second compression technique including a dictionary compression applying the second dictionary.

13. The system of claim 12, further comprising:
    generating the compressed data chunk including by applying the second compression technique to compress the second data column included in the data chunk.

14. A computer-implemented method, comprising:
    identifying, based at least on a first dictionary that enumerates a first set of unique values included in a first data column included in a data chunk, a first compression technique for generating a first compressed representation of the first data column having a fewest quantity of bytes;
    generating a compressed data chunk by at least applying the first compression technique to compress the first data column included in the data chunk; and
    storing, in a persistent page at a database, the compressed data chunk.

15. The computer-implemented method of claim 14, wherein the persistent page is associated with a variable.

16. The computer-implemented method of claim 15, wherein the persistent page is allocated based at least on a size of the first compressed representation of the first data column, such that a size of the persistent page corresponds to that of the compressed data chunk.

17. The computer-implemented method of claim 14, wherein the first compression technique comprises a dictionary compression.

18. A non-transitory computer readable medium storing instructions, which when executed by at least one data processor, result in operations comprising:
    identifying, based at least on a first dictionary that enumerates a first set of unique values included in a first data column included in a data chunk, a first compression technique for generating a first compressed representation of the first data column having a fewest quantity of bytes;
    generating a compressed data chunk by at least applying the first compression technique to compress the first data column included in the data chunk; and
    storing, in a persistent page at a database, the compressed data chunk.

19. The non-transitory computer readable medium of claim 18, wherein the persistent page is associated with a variable.

20. The non-transitory computer readable medium of claim 19, wherein the persistent page is allocated based at least on a size of the first compressed representation of the first data column, such that a size of the persistent page corresponds to that of the compressed data chunk.

\* \* \* \* \*